United States Patent [19]
Ferla et al.

[11] Patent Number: 5,933,734
[45] Date of Patent: Aug. 3, 1999

[54] HIGH SPEED MOS-TECHNOLOGY POWER DEVICE INTEGRATED STRUCTURE, AND RELATED MANUFACTURING PROCESS

[75] Inventors: Giuseppe Ferla, Catania; Ferruccio Frisina, Sant'Agata Li Battiati, both of Italy

[73] Assignee: SGS-Thomson Microelectronics S.r.l., Agrate Brianza, Italy

[21] Appl. No.: 08/813,009

[22] Filed: Mar. 4, 1997

Related U.S. Application Data

[62] Division of application No. 08/502,240, Jul. 13, 1995.

[30] Foreign Application Priority Data

Jul. 14, 1994 [EP] European Pat. Off. .............. 94830355

[51] Int. Cl.$^6$ ...................... H01L 21/8236; H01L 21/265
[52] U.S. Cl. ........................... 438/268; 438/273; 438/520
[58] Field of Search ................... 438/268–281, 438/520, 525

[56] References Cited

U.S. PATENT DOCUMENTS

| | | | |
|---|---|---|---|
| 3,914,857 | 10/1975 | Goser et al. ............................. | 438/525 |
| 4,412,242 | 10/1983 | Herman et al. ........................... | 357/52 |
| 4,417,385 | 11/1983 | Temple ..................................... | 29/571 |
| 4,816,882 | 3/1989 | Blanchard et al. ..................... | 357/23.4 |
| 4,893,165 | 1/1990 | Miller et al. ............................. | 357/43 |
| 4,916,509 | 4/1990 | Blanchard et al. ..................... | 357/65 |
| 4,920,388 | 4/1990 | Blanchard et al. ..................... | 357/23.4 |
| 4,975,782 | 12/1990 | Bauer ....................................... | 357/38 |
| 4,985,740 | 1/1991 | Shenai et al. ........................... | 357/23.4 |
| 5,047,833 | 9/1991 | Gould ...................................... | 357/71 |
| 5,119,153 | 6/1992 | Korman et al. ........................ | 357/23.4 |
| 5,173,435 | 12/1992 | Harada .................................... | 438/274 |
| 5,194,929 | 3/1993 | Ohshima et al. ....................... | 257/326 |
| 5,223,445 | 6/1993 | Fuse ........................................ | 438/525 |
| 5,240,874 | 8/1993 | Roberts ................................... | 438/525 |
| 5,270,227 | 12/1993 | Kameyama et al. ................... | 438/525 |
| 5,323,059 | 6/1994 | Rutter et al. ............................ | 257/768 |
| 5,444,271 | 8/1995 | Kuwahara .............................. | 257/136 |
| 5,550,067 | 8/1996 | Kuroyanagi et al. .................. | 438/275 |

OTHER PUBLICATIONS

Wolf, Stanley "Silicon Processing For the VLSI Era vol. 1: Process Technology", Lattice Press, pp. 384–400, 1986.
European Search Report from European Patent Application 94830355.7, filed Jul. 14, 1994.
Intel Corporation, Mountain View, University of California, Berkeley, John Wiley & Sons, A.S. Grove "Physics and Technology of Semiconductor Devices" Date Unknown.
Patent Abstracts of Japan, vol. 16, No. 275 (E–1219) Jun. 19, 1992 & JP–A–04 065 132 (Oki Electric Ind. Co., Ltd.).

*Primary Examiner*—John F. Niebling
*Assistant Examiner*—Michael S. Lebentritt
*Attorney, Agent, or Firm*—Wolf, Greenfield & Sacks, P.C.

[57] ABSTRACT

A high-speed MOS-technology power device integrated structure includes a plurality of elementary functional units formed in a lightly doped semiconductor layer of a first conductivity type, the elementary functional units including channel regions of a second conductivity type covered by a conductive insulated gate layer including a polysilicon layer; the conductive insulated gate layer also including a highly conductive layer superimposed over the polysilicon layer and having a resistivity much lower than the resistivity of the polysilicon layer, so that a resistance introduced by the polysilicon layer is shunted with a resistance introduced by the highly conductive layer and the overall resistivity of the insulated gate layer is lowered.

7 Claims, 6 Drawing Sheets

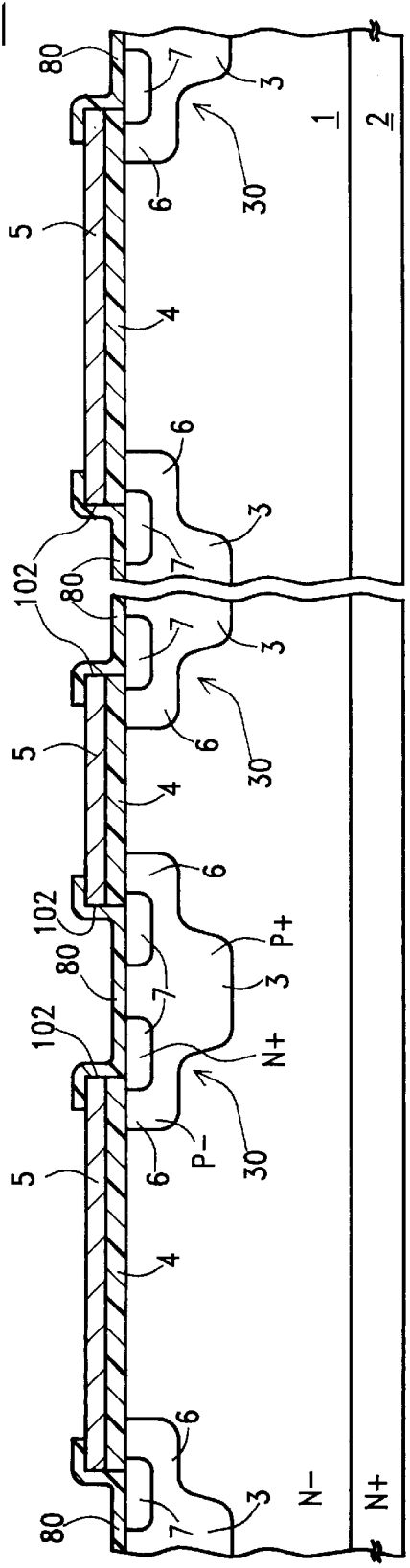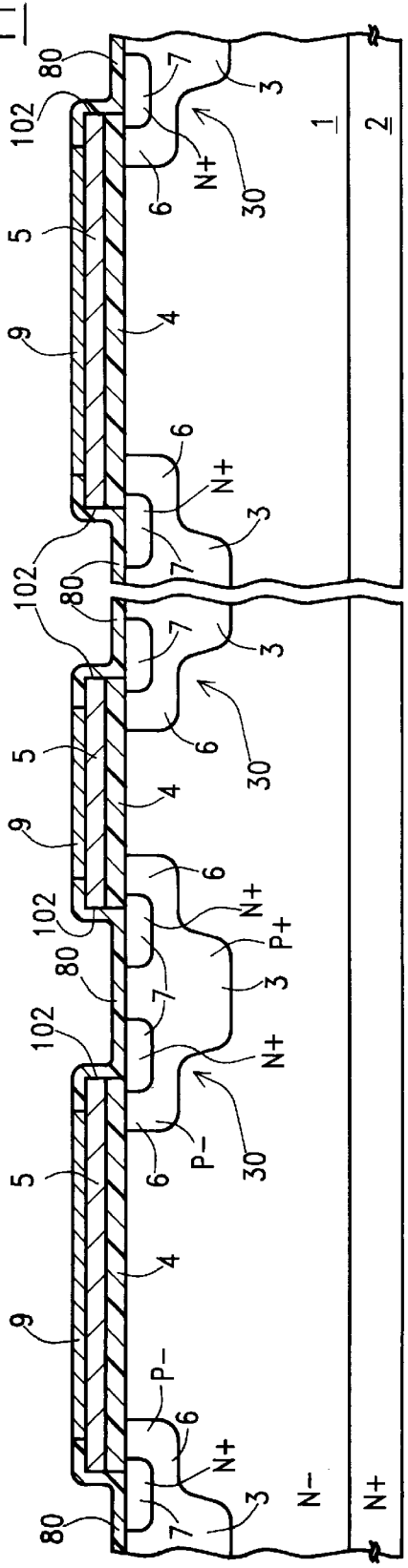

> 5,933,734

HIGH SPEED MOS-TECHNOLOGY POWER DEVICE INTEGRATED STRUCTURE, AND RELATED MANUFACTURING PROCESS

This application is a division of application Ser. No. 08/502,240, filed Jul. 13, 1995, entitled HIGH SPEED MOS-TECHNOLOGY POWER DEVICE INTEGRATED STRUCTURE, AND RELATED MANUFACTURING PROCESS, now pending.

BACKGROUND OF THE INVENTION

1. Field of the Invention

The present invention relates to a high-speed MOS-technology power device integrated structure, e.g. a power MOSFET or an Insulated Gate Bipolar Transistor (IGBT), and to a related manufacturing process.

2. Discussion of the Related Art

The need is known for high-speed (i.e. low switching time) MOS-technology power devices, for example in the field of Zero Crossing Switch (ZCS) power supplies wherein frequencies of up to 2 MHZ are common.

A MOS-technology power device chip includes a matrix of many millions of elementary vertical MOSFET units which individually contribute to the overall current of the power device; typically, the elementary units are polygonal-plan cells including a body region of the P conductivity type formed in a lightly doped semiconductor layer of the N conductivity type; the body region including a channel region which is covered by an insulated gate layer, i.e. a thin oxide layer and a polysilicon layer, forming a mesh over the surface of the N type layer; an N type annular source region is formed inside the body region. An insulating material layer covers the surface of the chip.

Narrow gate metal (aluminum) fingers connected to a gate metal pad extend on the surface of the chip to contact the underlying polysilicon gate layer through contact windows in the insulating material layer, and are interdigited with wider source metal fingers which, also through windows in the insulating material layer, contact the source regions and the body regions of all the elementary cells. The gate metal fingers are spaced about 1 mm, corresponding to about 60 elementary cells.

Due to the relatively high resistivity of polysilicon (50 Ohm/square) with respect to aluminum (10-3 Ohm/square), a gate resistance is introduced between the gate metal pad and cells. Such a resistance, together with the input capacitance of the elementary cells, forms an RC circuit, and is one of the main parameters affecting the speed of the power device.

A straightforward solution to this problem consists in augmenting the number of the gate metal fingers, thus reducing the spacing between them: if necessary, one gate metal finger every one elementary cell can be provided; in this way, the gate resistance of the elementary cells is obviously reduced, but a lot of chip area is wasted; while in fact the source metal fingers extend over the elementary cells, no elementary cells can be integrated under the gate metal fingers. Furthermore, the width of the source metal fingers must be reduced and their number must be correspondingly increased, with the consequence of a reduced uniformity in the source current distribution.

In view of the state of the art just described, it is an object of the present invention to provide a MOS-technology power device integrated structure wherein the gate series resistance can be reduced without necessarily augmenting the number of the gate metal fingers.

SUMMARY OF THE INVENTION

According to the present invention, this and other objects are attained by a MOS-technology power device integrated structure including a plurality of elementary functional units formed in a lightly doped semiconductor layer of a first conductivity type, the elementary functional units including channel regions of a second conductivity type covered by a conductive insulated gate layer including a polysilicon layer, wherein said conductive insulated gate layer also includes a highly conductive layer superimposed over said polysilicon layer and having a resistivity much lower than the resistivity of the polysilicon layer, so that a resistance introduced by the polysilicon layer is shunted with a resistance introduced by said highly conductive layer and the overall resistivity of the conductive insulated gate layer is lowered.

According to a preferred solution, said highly conductive layer is a silicide layer, preferably cobalt silicide.

As a result of the fact that the resistivity of silicide is about one order of magnitude lower than the resistivity of polysilicon, the gate resistance of the elementary units can be reduced even if the number of gate metal fingers is not augmented.

BRIEF DESCRIPTION OF THE DRAWINGS

The features of the present invention will be made more evident by the following detailed description of two particular embodiments, illustrated as non-limiting examples in the annexed drawings, wherein:

FIGS. 3–5 are cross-sectional views showing intermediate steps of a manufacturing process of the integrated structure of FIG. 2;

DETAILED DESCRIPTION

Figure 1:
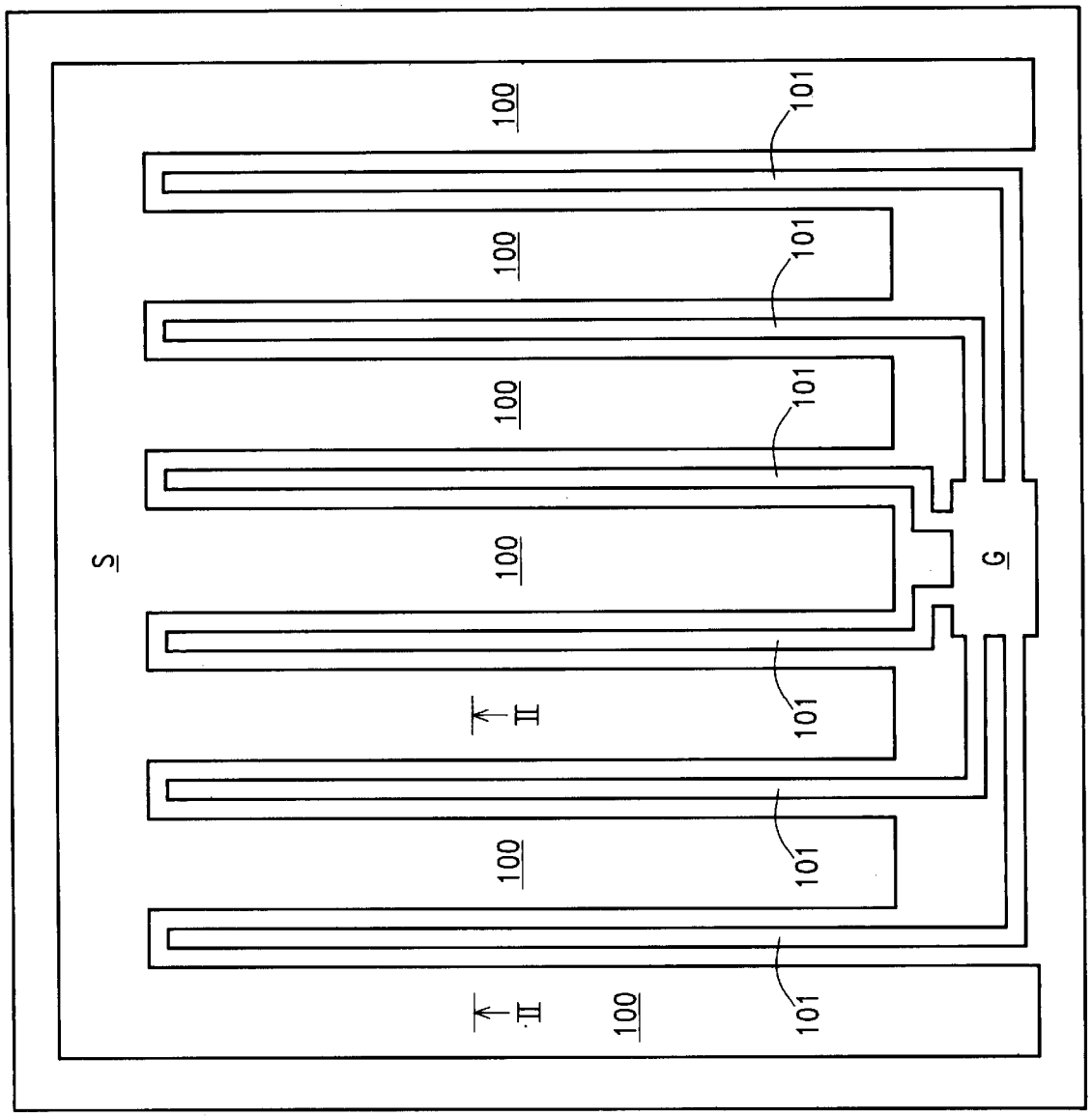
FIG. 1 is a top plan view of a MOS-technology power device chip.

FIG. 1 is a simplified top-plan view of a MOS-technology power device chip, for example a power MOSFET; two metal electrodes S and G, with respective metal fingers 100 and 101 interdigited to each other, are provided on the surface of the chip; the fingers 101 of the electrode G, forming a gate electrode of the power device, are much narrower than the fingers 100 of the electrode S, which forms a source electrode of the device.

The power MOSFET is made up of a matrix of elementary functional units, each representing an elementary vertical MOSFET which contributes for a respective fraction to the overall current of the power device.

Figure 2:
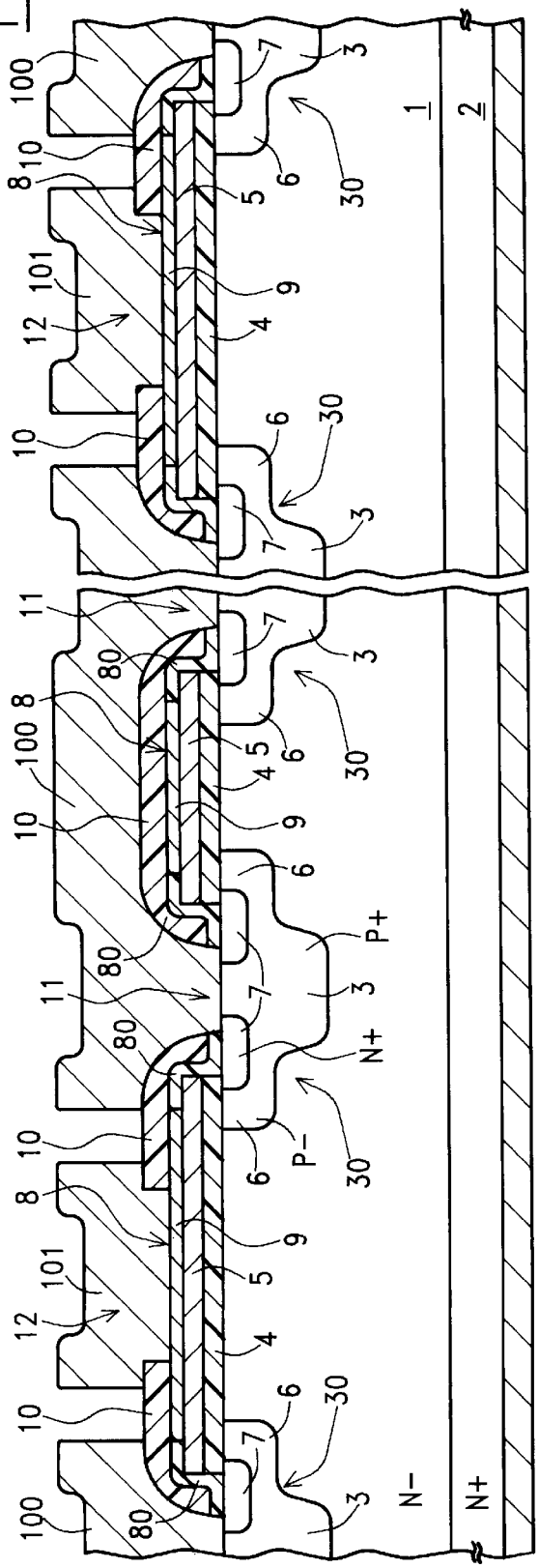
FIG. 2 is a cross sectional view along the line II-II of the chip of FIG. 1, showing a MOS-technology power device integrated structure according to a first embodiment of the present invention.

FIG. 2 is a cross-sectional view of a power MOSFET structure according to a first embodiment of the present invention; an elementary functional unit comprises a P type body region 30 formed in an N− layer 1, which is in turn superimposed over an N+ substrate 2. Typically, the body region 30 has a polygonal plan, for example square, and includes a central P+ deep body region 3 and a lateral P− channel region 6; an annular N+ source region 7 is provided inside the body region 30.

An insulated gate layer 8, comprising a polysilicon layer 5 superimposed over a thin oxide layer 4, covers the surface of the N− layer 1 and extends over the P− channel regions 6 of the elementary functional units. The insulated gate layer 8 also comprises a silicide layer 9, for example a cobalt silicide, which covers the polysilicon layer 5 and which is in turn covered by a dielectric layer 10; contact windows 11 are provided in the dielectric layer 10 to allow the metal fingers 100 of the source electrode S to come into contact with the N+ source regions 7 and the P+ deep body regions 3 of all the elementary units; further contact windows 12 are also provided in the dielectric layer 10 to allow the metal fingers 101 of the gate electrode G to come into contact with the silicide layer 9.

It should be noted that elementary functional units are present under the source metal fingers 100, but not under the gate metal fingers 101, and that the width of a gate metal finger 101 is higher than the pitch between adjacent elementary units; this means that each gate metal finger 101 inherently causes a waste of active chip area, so that the minimum number of gate metal fingers should be provided: as already mentioned, the gate metal fingers 101 are generally spaced of about 1 mm, corresponding to about 60 elementary units. While however in prior art structures this causes a relatively high gate resistance to be introduced due to the resistivity of polysilicon (50 Ohm/square), by using the silicide layer 9 (having a resistivity of about 1 ohm/square), the gate resistance is substantially the same as if one gate metal finger 101 every one elementary cell would be provided. Other elements can be used instead of cobalt, for example titanium and tungsten; titanium and tungsten silicides share with cobalt silicide the feature of a low resistivity, but are less stable at high temperatures.

A process for the manufacturing of the power MOSFET structure shown in FIG. 2 provides for the epitaxial growth of an N− semiconductor layer 1 over an N+ semiconductor substrate 2.

A heavy dose of a P type dopant is then selectively implanted into selected regions of N− layer 1, by means of a mask; the dopant is then made to diffuse by means of a thermal process, to form P+ deep body regions 3.

A thin oxide layer 4 is then thermally grown over the surface of the N− layer 1, and a polysilicon layer 5 is deposited over the thin oxide layer 4. The polysilicon layer 5 and the thin oxide layer 4 are then selectively removed around the deep body regions 3 to open windows 102.

A low dose of a P type dopant is then implanted using the polysilicon layer 5 as a mask, and it is then made to diffuse by means of a thermal process, to form P− channel regions 6 extending under the thin oxide layer 4. The channel regions 6 and the deep body regions 3 form the body regions 30 of the elementary cells.

A heavy dose of an N type dopant is then selectively implanted into the body regions of the elementary cells, masking with a photoresist the central portion of the deep body regions 3. The dopant is then made to diffuse by means of a thermal process to form annular source regions 7.

Up to this point, the process is conventional.

Figure 3:
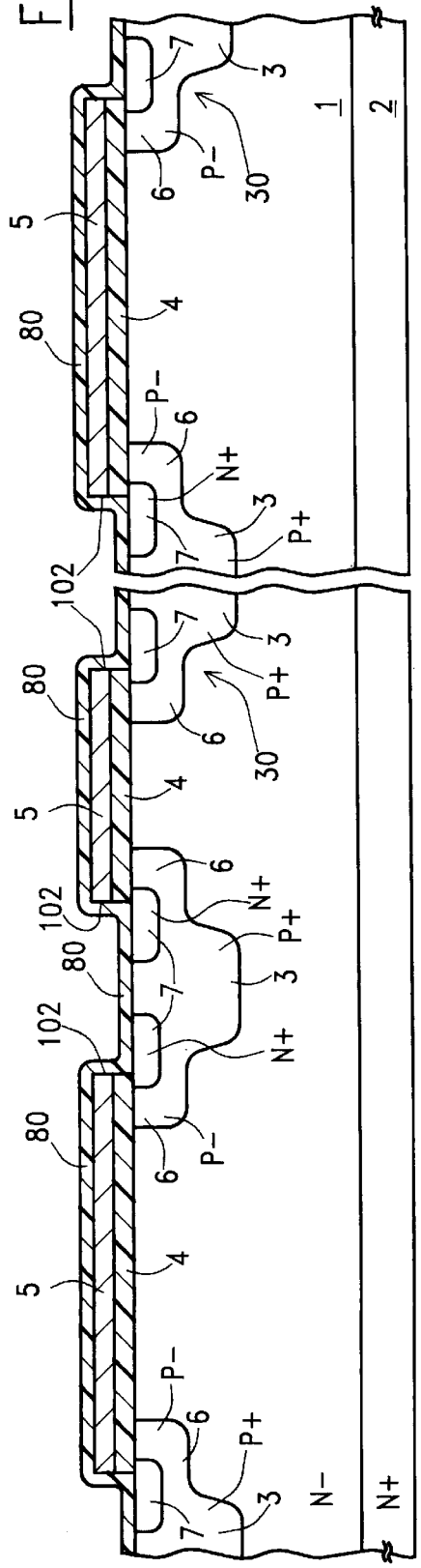

During the abovementioned thermal processes, an oxide layer 80 grows over the whole surface of the chip (FIG. 3). A photoresist layer (not shown) is deposited over the oxide layer 80, and it is selectively removed over the polysilicon layer 5 to provide a mask for the subsequent etching of the oxide layer 80; in this way, the oxide layer 80 is selectively removed from the polysilicon layer 5 (FIG. 4).

Figure 6:
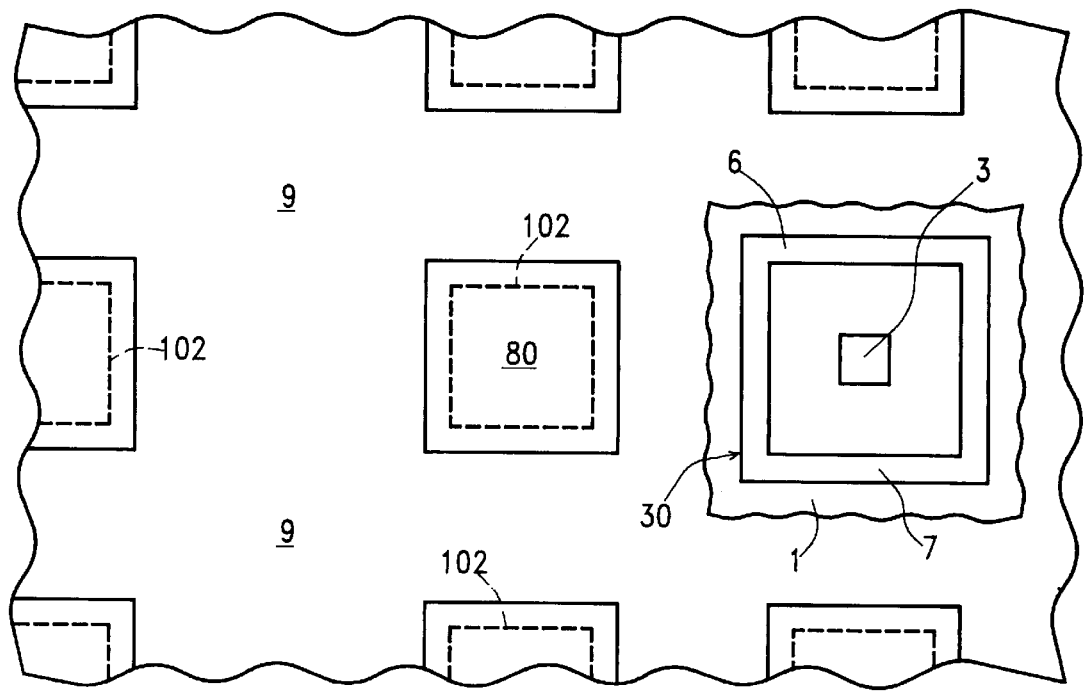
FIG. 6 is a top-plan view of the structure shown in FIG. 5.

A layer of cobalt is deposited over the whole surface of the chip, which is then submitted to a thermal process at a temperature of about 500° C. Over the polysilicon layer 5, the cobalt reacts to form a cobalt silicide (CoSi) 9 (FIGS. 5 and 6). The cobalt layer over the oxide layer 80 is then removed.

An insulating material layer 10 is then deposited over the whole chip surface, and contact windows 11 and 12 are opened therein, respectively over the elementary cells and over the silicide layer 9 (FIG. 2).

A metal layer is deposited over the insulating material layer 10, and it is selectively etched to form the gate metal fingers 101 and the source metal fingers 100.

The process described above does not allow achievement of very high scales of intergration; since in fact it involves several photolitographic masks, the necessity of respecting the alignment rules prevents the dimensions of the cells from being scaled down.

For this reason, such a process is suitable for the manufacturing of high-voltage MOS-technology power devices (designed for applications involving voltages of up to 500 V), wherein the dimensions of the cells are intrinsically high.

A manufacturing process suitable to obtain a high-speed MOS-technology power device according to a second embodiment of the present invention, allowing achievement of very high scales of integration, is shown in FIGS. 7–13.

An N− semiconductor layer 1 is epitaxially grown over the N+ substrate 2.

Figure 7:
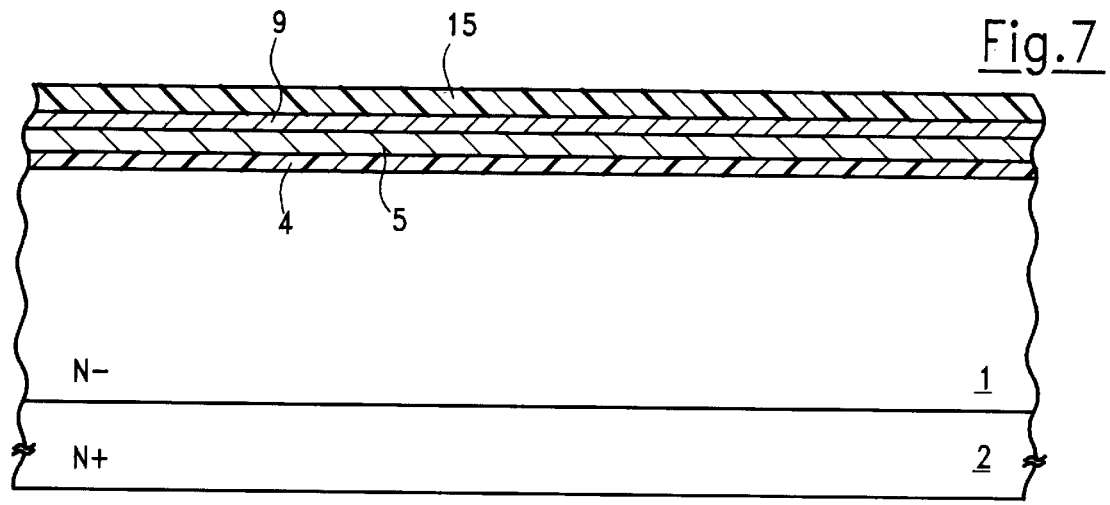
FIGS. 7–12 are cross-sectional views showing intermediate steps of another manufacturing process, suitable for obtaining a MOS-technology power device integrated structure according to a second embodiment of the present invention.

A thin oxide layer 4 is thermally grown over the surface of the N− layer 1; a polysilicon layer 5 is deposited over the thin oxide layer 4. A cobalt layer is deposited over the polysilicon layer 5, and the chip is then submitted to a thermal process at a temperature of about 500° C. so that cobalt reacts with polysilicon to form a cobalt silicide layer 9. A further oxide layer 15 is then formed over the silicide layer 9 (FIG. 7).

Figure 13:
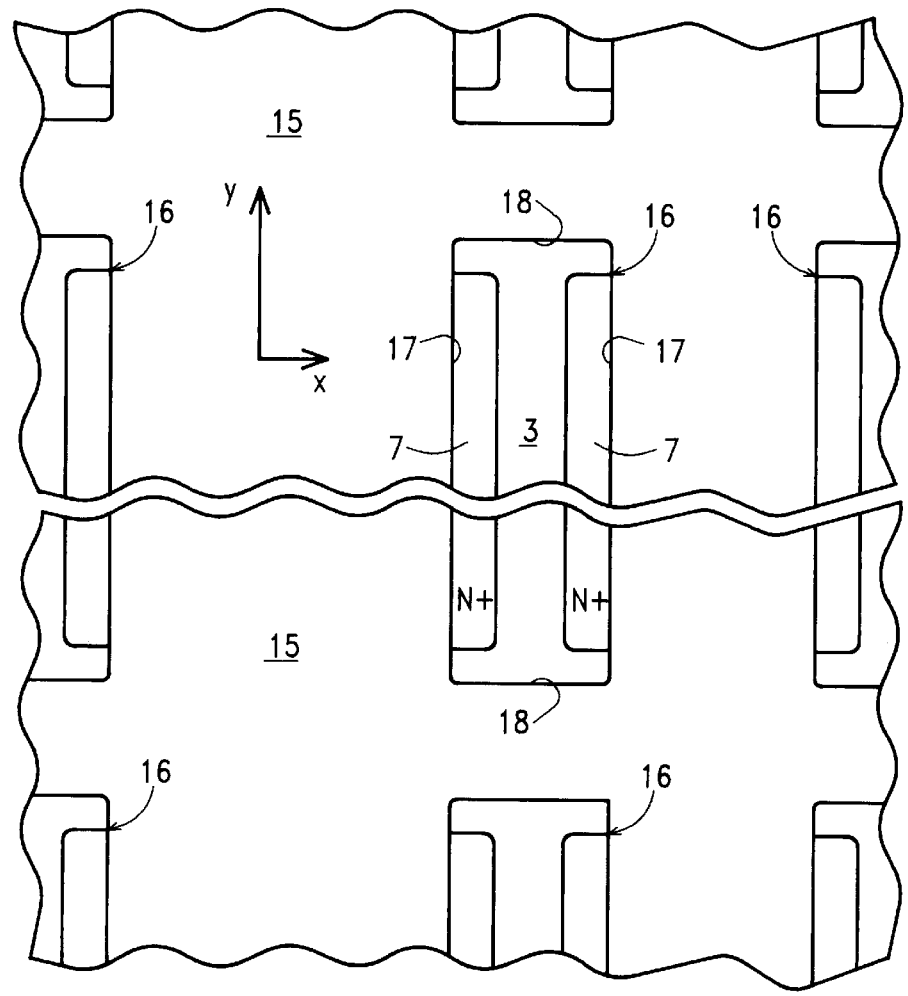
FIG. 13 is a top-plan view of the structure shown in FIG. 11.
Figure 8:
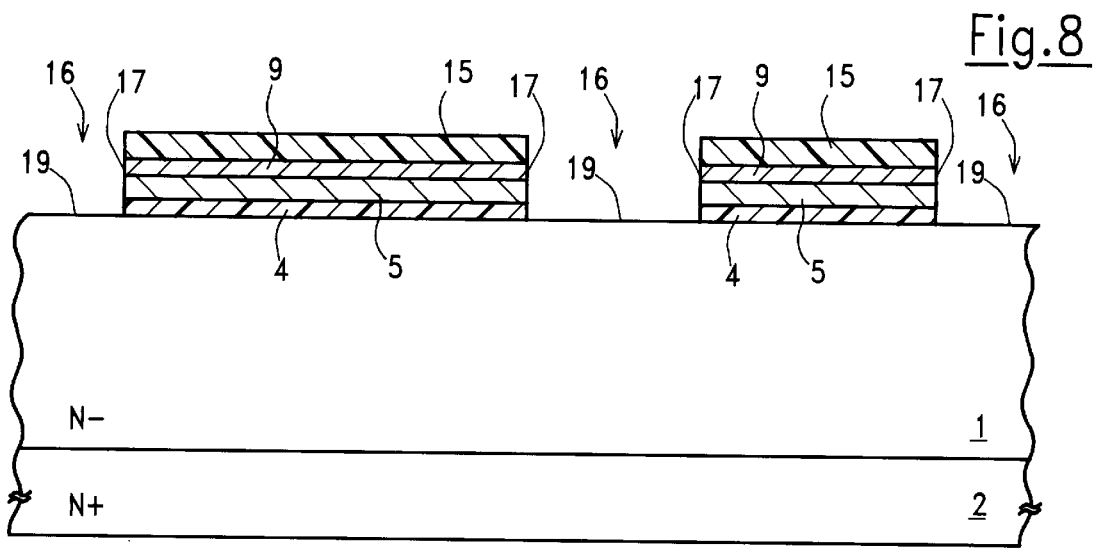

The oxide layer 15, the silicide layer 9, the polysilicon layer 5 and the thin oxide layer 4 are then selectively removed to open windows 16 having substantially a rectangular shape with two elongated edges 17 along a longitudinal direction (Y in FIG. 13), and two short edges 18 along a transversal direction (X in FIG. 13); consequently, uncovered surface stripes 19 of the N− layer 1 are obtained (FIGS. 8 and 13). This step is performed in a per-se known way by covering the oxide layer 15 with a photoresist (not shown), and removing it from the regions of the oxide layer 15 which are to be exposed to the action of an etchant with high selectivity towards silicon dioxide, silicide and polysilicon with respect to the photoresist material. The windows 16, and thus the uncovered surface stripes 19, are much more elongated in the Y direction than in the X direction (at least two orders of magnitude).

Figure 9:
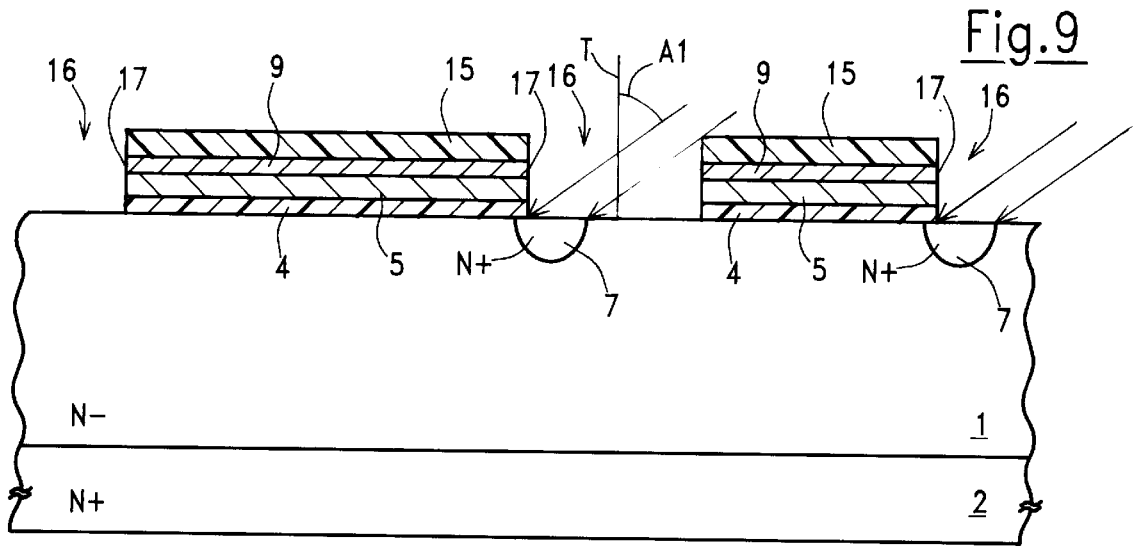

A high dose of an N type dopant is then selectively implanted into the N− layer 1, along a direction which lies in an orthogonal plane transversal to the stripes 19 (such as the plane of FIGS. 7–12), and which is tilted at an angle A1 with respect to a direction T orthogonal to the surface of the N− layer 1; the tilt angle A1 can have a value ranging from 45° to 60°, depending on the overall thickness of the layers 15, 9, 5 and 4, so that these layers act as an implantation mask to allow the dopant being implanted only in regions near one of the edges 17 of the windows 16 and under the thin oxide layer 4, shielding the middle of the stripes 19. Inside each uncovered surface stripe 19, an N+ stripe 7 extending along said edge 17 of the windows 16 is thus formed (FIG. 9).

The previous step is repeated tilting the dopant ion beam of an angle substantially symmetrical to A1 with respect to the direction T, to form in a same manner another N+ stripe 7 along the opposite edge 17 of the windows 16.

Since implanting apparatus are commercially available which allow a fine control of the angle of tilting of the dopant ion beam in the range 0°–60°, the tolerance on the dimension along the X direction of the N+ source regions 7 substantially depends on the tolerance of the overall thickness of the oxide and insulated gate layers 15 and 8. It is known that the tolerance on the thickness of the grown or deposited layers is much narrower than the alignment tolerance between photolitographic masks. In current photolitographic apparatus a tolerance of about 0.2 μm must be taken into account when two masks are to be aligned, thickness tolerances of 2–3% for layers of 500 Angstrom thickness are easily attainable. This technique allows a reduction in the dimension along the X direction of the source regions 7.

A photoresist mask (not shown) prevents the dopant from being implanted into the regions of the uncovered surface stripes 19 near the short edges 18 of the windows 16; the N+ source regions 7 do not extend therefore for the whole length of the edges 17 of the windows 16 (FIG. 13).

A P type dopant, such as boron, is then selectively implanted into the N– layer 1 along a direction which lies in said transversal plane, and which is tilted at an angle A2 with respect to the direction T; in this case the tilt angle is chosen, together with the implantation energy, to make the dopant penetrate under one edge 17 of the windows 16 farther than the N+ regions 7; a suitable angle can be in the range 35°–60°, preferably 45°. In each uncovered surface stripe 19 a P– type stripe 6, extending along one of the edges 17, is thus formed around the N+ stripe 7, and extends under the thin oxide layer 4 to form a channel region of the elementary MOSFETs (FIG. 9). The implantation dose is generally low, and depends on the desired threshold voltage of the power MOSFET; the implantation energy must be higher than that used for the implantation of N+ source regions 7.

The previous step is repeated tilting the dopant ion beam at an angle substantially symmetrical to A2 with respect to the direction T, to form in a same manner another P– type stripe 6 along the opposite edge of each window 16.

Differently from the N+ source regions 7, the P– regions 6 extend for the whole length of the uncovered surface stripes 19; the absence of the N+ source regions 7 near the short edges 18 of the windows 16 prevents a channel short-circuit from occurring (since in fact no channel regions are provided under the short edges of the windows 16, if the source regions 7 extend for the whole length of the uncovered surface stripes 19 they would be in direct contact with the N– layer 1, thus causing a source-drain short-circuit).

Figure 10:
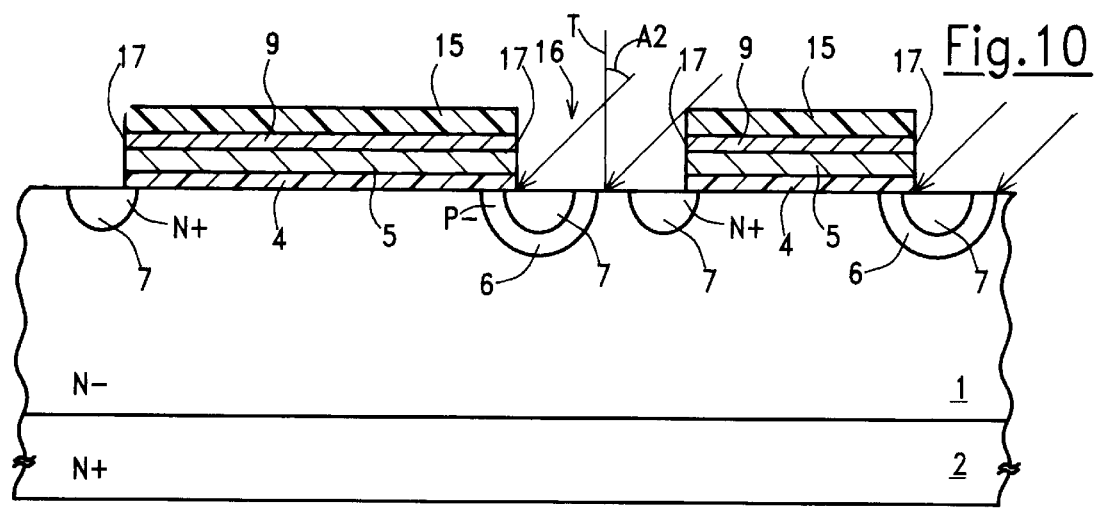
Figure 11:
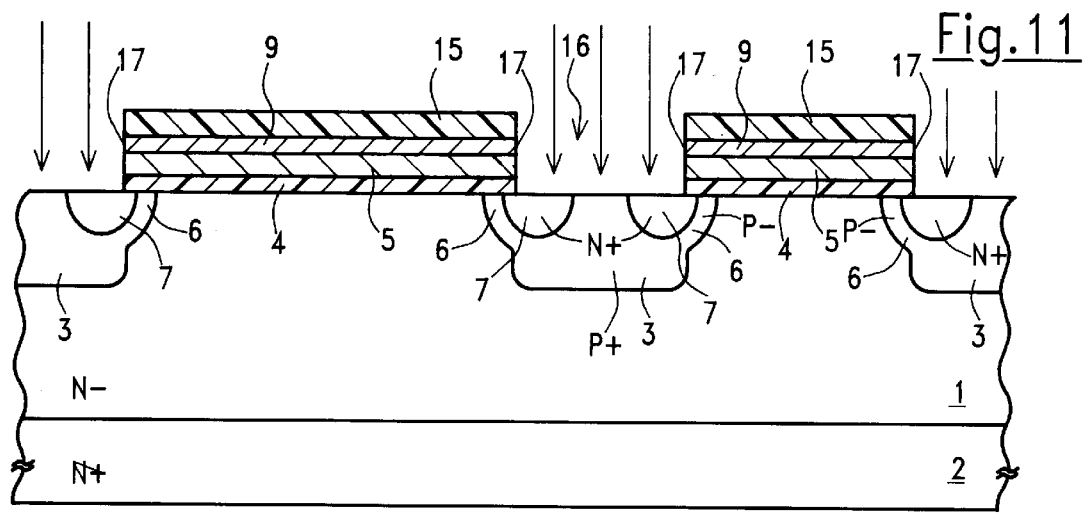

A high dose of a P type dopant is then implanted along the orthogonal direction T at a relatively high energy (100 KeV or greater), the layers 15, 9, 5 and 4 acting as a mask so that after the implantation P+ deep body regions 3 are formed which are substantially self-aligned with the edges 17 and 18 of the windows 16 (FIG. 10). The P+ deep body regions 4 extend therefore under all the N+ source regions 7 which, according to the way in which they are formed, are also self-aligned with the elongated edges 17 of the windows 15 (FIG. 11). The implantation energy is chosen in such way as to locate the peak dopant concentration just under the source regions 7, and the dopant dose is chosen in such a way as the dopant concentration at the surface is of the order of $10^{18}$ atoms/cm$^3$.

A high temperature, low time duration thermal step is at this point performed to activate the dopants and to partially eliminate the defects caused by the implanted dopants. Such a step is performed in Rapid Thermal Annealers (RTAs), and does not cause significant dopant redistribution; the doping profiles and dimensions of the various semiconductor regions are therefore not affected.

Oxide sidewall spacers 50 are then formed along the edges 17 and 18 of the windows 16 by means of CVD deposition at low temperatures (300–400° C.).

Figure 12:
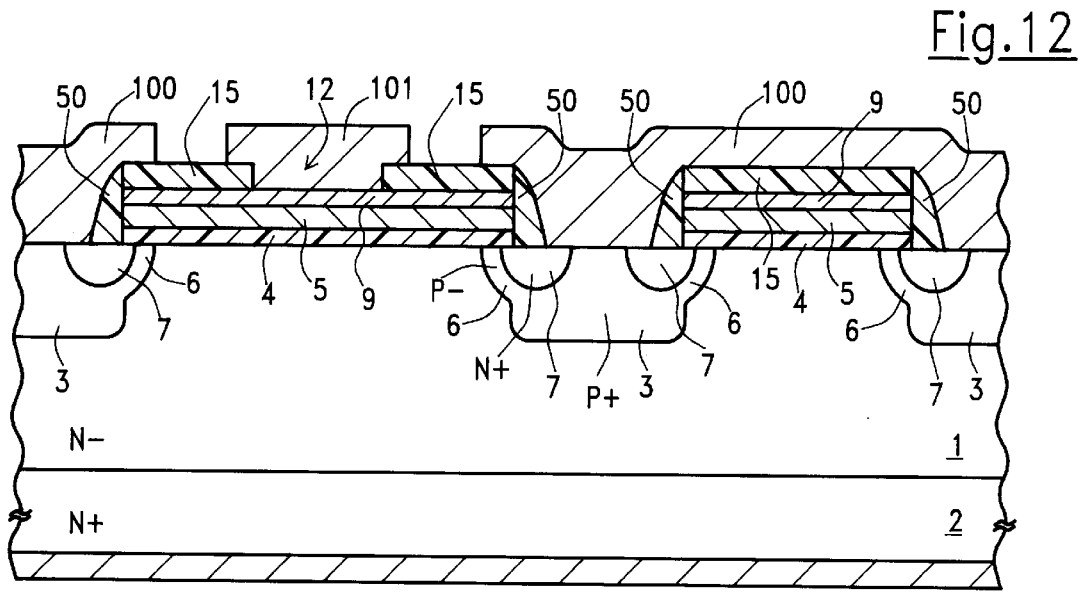

Contact windows 12 are opened in the oxide layer 15 to expose the silicide layer 9 (FIG. 12).

A metal layer is deposited over the oxide layer 15, and it is selectively etched to form the gate metal fingers 101 (which contact the silicide layer 9 through the contact windows 12) and the source metal fingers 100.

The process according to the invention requires only one mask instead of the four masks required by the conventional processes. The integrated structure thus obtained is self-aligned with the edges 17 and 18 of the windows 16.

The described sequence of steps could be altered without affecting the resulting structure; more precisely, the implantation steps leading to the formation of the source regions, of the channel regions and of the deep body regions can be interchanged. It would therefore be possible, for example, to initially form the deep body regions 3, then the channel regions 6, and finally the source regions 7.

The present invention applies as well to IGBTs, the only difference being the conductivity type of the substrate 2.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process for the manufacturing of a high-speed MOS-technology power device integrated structure, comprising the steps of:

a) selectively implanting and thermally diffusing a heavy dose of a first dopant of a second conductivity type into a lightly doped semiconductor material layer of a first conductivity type to form a plurality of heavily doped deep body regions;

b) growing a thin oxide layer over a surface of the semiconductor material layer, and depositing a polysilicon layer over the thin oxide layer;

c) selectively removing the polysilicon layer and the thin oxide layer around each deep body region;

d) implanting and thermally diffusing a low dose of a second dopant of the second conductivity type using the polysilicon layer as a mask, to form channel regions, said channel regions extending under the thin oxide layer;

e) selectively implanting and thermally diffusing a heavy dose of a third dopant of the first conductivity type to form heavily doped source regions;

f) selectively removing from the polysilicon layer an oxide layer formed over the polysilicon layer and over the body regions during said thermal diffusion of the first, second and third dopants;

g) depositing over the whole surface a layer of a metallic element suitable to form, together with silicon, a silicide layer;

h) performing a thermal process to make the metallic element react with polysilicon to form a silicide layer over the polysilicon layer.

2. Process according to claim 1, wherein said metallic element is cobalt.

3. Process for the manufacturing of a high speed MOS-technology power device integrated structure, comprising the steps of:

a) growing a thin oxide layer over a surface of a lightly doped semiconductor material layer of a first conductivity type, depositing a polysilicon layer over the thin oxide layer, forming a silicide layer over the polysilicon layer, covering the silicide layer with an insulating material layer;

b) selectively removing the insulating material layer, the silicide layer, the polysilicon layer and the thin oxide layer to form a plurality of windows defining respective uncovered surface areas of the semiconductor material layer;

c) implanting a high dose of a first donant of a second conductivity type along directions which are tilted of a first prescribed angle with respect to a direction orthogonal to a surface of the semiconductor material layer, said first angle depending on an overall thickness of the thin oxide layer, the polysilicon layer, the silicide layer and the insulating material layer to prevent the first dopant from being implanted in a central region of said uncovered surface areas, to form source regions of the first conductivity type;

d) implanting a low dose of a second dopant of the first conductivity type along directions tilted at a second prescribed angle with respect to said orthogonal direction, to form doped regions of the second conductivity type each comprising lightly doped channel regions extending under edges of the windows;

e) implanting a high dose of a third dopant of the second conductivity type substantially along said orthogonal direction, the insulating material layer acting as a mask, to form heavily doped regions substantially aligned with the edges of the windows.

4. Process according to claim 3, wherein said silicide layer is a cobalt silicide.

5. Process according to claim 3, wherein said first prescribed angle is chosen in the range of 45°–60°.

6. Process according to claim 3, wherein said second prescribed angle is chosen in the range of 35°–60°.

7. Process according to claim 3, wherein said windows have two elongated edges and two short edges, and in that:

said first dopant of the first conductivity type is implanted along two directions which lie in a plane transversal to said elongated windows and orthogonal to the semiconductor material layer surface, and which are substantially symmetrically tilted at said first prescribed angle with respect to an orthogonal direction to form pairs of heavily doped elongated source regions of the first conductivity type which extend along said two elongated edges of each elongated window and which are separated a central stripe;

said second dopant is implanted along two directions which lie in said plane, and which are substantially symmetrically tilted at said second prescribed angle with respect to said orthogonal direction, to form lightly doped elongated channel regions extending under the two elongated edges of each elongated window.

* * * * *

UNITED STATES PATENT AND TRADEMARK OFFICE
CERTIFICATE OF CORRECTION

PATENT NO.  : 5,933,734
DATED       : August 3, 1999
INVENTOR(S) : Giuseppe Ferla and Ferruccio Frisina It is certified that error appears in the above-identified patent and that said Letters Patent is hereby corrected as shown below:

On the title page, item [73] should read:

[73] Assignee:    SGS-Thomson Microelectronics S.r.l., Agrate Brianza,
                  Italy and Consorzio per la Ricerca sulla
                  Microelettronica nel Mezzogiorno, Catania, Italy Signed and Sealed this Eighth Day of February, 2000

Attest:

Q. TODD DICKINSON

*Attesting Officer*          *Commissioner of Patents and Trademarks*